United States Patent [19]

Howarth

[11] Patent Number: 4,499,584

[45] Date of Patent: Feb. 12, 1985

[54] DATA VALIDATION MONITOR

[75] Inventor: Robert F. Howarth, El Cajon, Calif.

[73] Assignee: The United States of America as represented by the Secretary of the Navy, Washington, D.C.

[21] Appl. No.: 499,030

[22] Filed: May 26, 1983

[51] Int. Cl.[3] .............................................. H04L 1/22

[52] U.S. Cl. ................................ 375/58; 340/870.11; 360/47; 371/68

[58] Field of Search ....................... 307/441, 442, 443; 330/124; 340/870.01, 870.11, 825.01; 358/314; 360/47; 371/8, 31, 68; 375/38, 58, 99, 102; 455/59, 63, 296, 303, 305; 369/59, 99

[56] References Cited

U.S. PATENT DOCUMENTS

| | | | |
|---|---|---|---|
| 3,476,922 | 11/1969 | Yiotis | 371/68 |
| 4,202,018 | 5/1980 | Stockham, Jr. | 360/47 |
| 4,342,112 | 7/1982 | Stodola | 371/68 |
| 4,393,493 | 7/1983 | Edwards | 340/825.01 |
| 4,442,521 | 4/1984 | Inaba et al. | 371/68 |

*Primary Examiner*—Benedict V. Safourek
*Attorney, Agent, or Firm*—Robert F. Beers; Ervin F. Johnston; Thomas G. Keough

[57] ABSTRACT

A method and apparatus is provided for detecting and rejecting spurious signals that may arise in incoming data. A remotely disposed data producing sensor for each sensor data channel and a single blind data channel extend to a receiver or a recorder. A data link is provided linking each sensor channel to the recorder and a one-shot multivibrator generates a sensor channel pulse whenever a signal having less than a predetermined rise time and exceeding a predetermined magnitude comes through the sensor data channel. Another one-shot multivibrator coupled to the blind channel generates a blind channel pulse whenever a signal satisfies the same conditions as for the sensor channel. An AND gate associated with each sensor data channel initiates an interruption of the data link for the duration of a coincident receipt of the sensor channel pulse and the blind channel pulse to connect a d.c. potential source to the recorder for the duration of the multivibrator pulse and to recouple the data link to the recorder when the coincident receipt of the sensor channel pulse and the blind channel pulse stops. Thus, spurious signals appearing on both channels are detected and eliminated from the data channel. Data coming only on the data channel and not appearing on the blind channel passes to the recorder without interruption. A plurality of the data channels each having a sensor cooperate with a single blind channel to eliminate spurious signals from all the data channels so that the single blind channel can improve the validity of data transmitted from a number of data sources simultaneously.

14 Claims, 3 Drawing Figures

DATA VALIDATION MONITOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Extraneous pickup caused by undesirable electromagnetic, mechanical or thermal disturbances is often recorded as data in many electronic systems. Irrespective of the wide variety of preventative measures, spurious signals are received and carried by data channels to one extent or another.

Shielding, coaxial cables, twisted pairs and differential input amplifiers, to name a few preventative measures, have been used by designers and to one degree or another helped eliminate spurious signals. Other times, unwanted electronic pickups are removed by filtering; but here again, filtering is not always effective particularly in the case where there are significant frequency components in the neighborhood of the desired authentic data being transmitted through the system. Spurious signal problems are recurring and bothersome if the transmission lines are long.

An error checking circuit for a digital system was disclosed by Kevin C. Stodola in U.S. Pat. No. 4,342,112. The circuit detected failures on a dual redundant bus structure was capable of detecting single point failures within the error checking circuit itself. The circuit provides for what it calls a two rail logic in which signals are generated in both true and complement form on two rails of output flip-flops. The generated signals present on the two rails of a signal pair are intended always to be complementary. An error is indicated if the two rails of any signal pair are not complementary. Any error at any signal pair within the two rail logic error circuit will be transmitted to the following logic in the circuit such that the error may be detected at the final output of the circuit. Thus, any error presented to the checking circuit, or occurring within the circuit, will be indicated at the final output of the circuit. As a further refinement the output logic states on the two rails are changed from time to time so that the various logic gates within the checking circuit are frequently used so that a fault or defect occurring within the circuit itself is readily detectable. Circuit and bus failure are identified and appropriate action can be taken.

Irrespective of the meritorious advances for error reduction, there is a continuing need in the state-of-the-art for an apparatus and method for detecting spurious signals picked up and transmitted between at least one sensor and its data storage station that removes spurious signals from the valid data prior to its being recorded.

SUMMARY OF THE INVENTION

The present invention is directed to providing an apparatus and method for rejecting spurious signals from incoming data at a recorder. At least one remotely disposed sensor defines at least one data channel and a blind channel is created alongside the sensor channel by identical elements but without the sensor. A long cable serves as a common transmission path to a data link at the recorder. A one-shot multivibrator is coupled to the cable for generating a sensor channel pulse whenever a signal appears on the sensor data channel that exceeds a predetermined threshold. Another one-shot multivibrator is coupled to the cable and generates a blind channel pulse whenever a signal on the blind channel exceeds a predetermined threshold. An AND gate is coupled to the sensor channel one-shot multivibrator and the blind channel one-shot multivibrator for initiating an interruption of the data link in the sensor channel for the duration of a coincident receipt of a blind channel pulse and a sensor channel pulse. A solid state switch is coupled to the AND gate and connects a potential source to the recorder throughout the duration of the coincident receipt of the blind channel pulse and sensor channel pulse. The switch recouples the data link to the recorder when the coincident receipt stops. Thus, a spurious signal associated with extraneous pickup appearing on both the sensor channel and the blind channel will be eliminated from the system whereas a data pulse or analog signal appearing on only the sensor channel will pass unimpeded to the recorder.

The method of the invention calls for providing at least one single sensor data channel, a blind data channel and a data link for each sensor data channel. Generating a sensor channel pulse whenever a signal on the sensor data channel exceeds a predetermined threshold and generating a blind channel pulse whenever a signal on the blind channel exceeds a predetermined threshold enables an initiating of an interruption of the data link for the duration of the coincident receipt of the sensor channel pulse and the blind channel pulse. Providing a potential source and connecting the potential source to the recorder throughout the duration of the coincident receipt of the sensor channel pulse and the blind channel pulse eliminates a spurious signal from reaching the interconnected recorder. Disconnecting the potential source from the recorder and reconnecting the data link to the recorder after the coincident receipt of the sensor channel pulse and the blind channel pulse enables the reception of information pulses by the recorder once again after unwanted spurious signals have been eliminated from the data transmission cable.

It is a prime object of the invention to provide an apparatus and method for eliminating extraneous pickups from compromising the validity of data in a data transmission system.

Yet another object of the invention is to provide for the elimination of spurious signals in data transmission systems having long data transmission cables.

A further object is to provide an apparatus and system for monitoring extraneous pickups and rejecting them from a data transmitting system.

Still another object of the invention is to provide for spurious signal rejection in a data transmission system that is cost effective and highly reliable.

Yet another object is to provide an apparatus and method for rejecting spurious signals that is adaptable to analog and data signal systems.

A further object is to provide a blind sensor channel contiguous with at least one sensor data channel for assuring the elimination of spurious signals from the data carried on the sensor data channel.

Still another object of the invention is to provide for the recording of all signals including spurious signals appearing on the sensor channels and the blind channel to enable a subsequent processing of the information.

Yet another object is to provide for the determination of extraneous pickups by comparing signals on a sensor data channel with signals appearing on a blind channel.

Yet another object of the invention is to provide for spurious signal elimination that is insensitive to large transient perturbations that could overdrive and circumvent to protection offered by the commonly used differential amplifier, twisted pair approach.

These and other objects of the invention will become more readily apparent from the ensuing specification and claims when taken with the drawings.

DESCRIPTION OF THE PREFERRED EMBODIMENT

Figure 1:
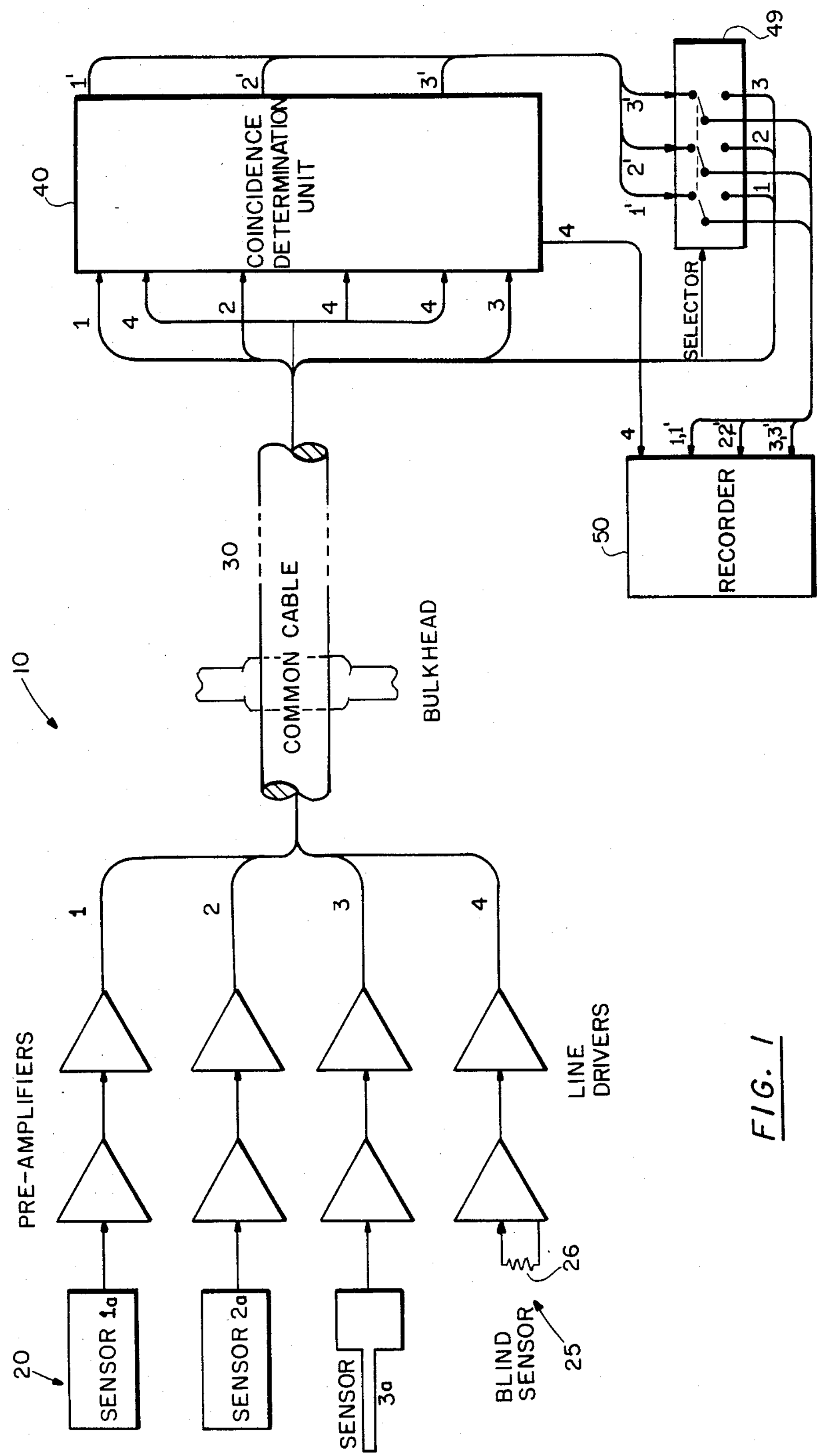
FIG. 1 is a schematical representation of an operationally disposed sensor-data gathering system having a contiguous blind channel to provide the capability for rejection of spurious signals.

Referring now to the drawings and in particular to FIG. 1 a data generating system 10 has a number of sensors 20 collecting data for transmission over a common cable 30 through a coincidence determination unit 40 to a central data recorder 50 or other suitable means for utilizing the gathered data.

The data gathering system can be any one of numerous such systems for keeping track of or monitoring changing phenomenon. Sensors 1*a*, 2*a* and 3*a* could be, for example, photo-optical or sensitive to change in acoustic pressure, ambient salinity, or temperature in the ocean. The data from a host of sensors for one phenomena or another in a particular location are coupled to a common cable and define separate sensor data channels in the common cable to the recorder. Although not specifically shown, it is envisioned that frequency multiplexing, time division multiplexing, etc. techniques could be employed to expedite the data transfer by merely including appropriate multiplexers and demultiplexers at opposite ends of common cable 30.

Sensors 1*a*, 2*a* and 3*a* are depicted for exemplary purposes it being understood that this number of sensors is not limited and any number can be provided at a particular location. The sensors could be a mixed variety, that is, sensor 1*a* could be a photo-optical sensor, sensor 2*a* an acoustic sensor, sensor 3*a* a temperature sensor, and so on, so that the signals generated by each sensor could indicate the occurrence of totally unrelated phenomena of one from the other. Each of the sensors feeds analog or digital data in a separate and distinct sensor data channel 1, 2 or 3 for carrying information back to recorder 50. A preamplifier and line driver are included with each sensor to assure transmission to the recorder.

Along with the sensor data channels, a blind sensor channel 25 is created by attaching a blind circuit or dummy load 26 across its associated preamplifier. The blind circuit is included in the data gathering system effectively in parallel with the active photo-optical or other sensors.

The blind or monitor channel is identical electrically and spatially to one or more of the active data sensor channels except for including the sensor element itself. In the blind channel the sensor element otherwise included in the other sensor channels is muted, occluded or not included at all and a dummy load substitutes as shown in the figure. The dummy load 26 in this case simulates the sensor output impedance that would otherwise be present.

The common cable extending from the sensors to coincidence determination unit 40 and recorder 50 is a long cable with respect to the other conductor lengths in the data gathering system and is, in one form, a multistrand cable with each strand serving as a separate conduit for one of the sensor channels or the blind channel. The data inputs to the left side of the common cable in FIG. 1 pass through sensor channels 1, 2 and 3 and a path is maintained for blind channel 4. Multiple outputs from the right side of the cable go to unit 40, selector box 49 and recorder 50.

The data outputs from the common cable are fed to a selector box 49 as well as to the coincidence unit. The selector box is included to provide for the recorder, the complete data information coming from sensors 1*a*, 2*a*and 3*a* as well as the spurious signals acquired through the sensors and the cable. Thus, the information to be recorded in recorder 50 can consist of the data and spurious signals of each of the channels when the selector switch 49 is switched to the downward position or can receive the data with spurious signals removed at switch positions 1', 2' and 3' when selector switch 49 is switched to the upper position. In either case the spurious signals appearing on blind channel 4 will be recorded for reference purposes.

Figure 2:
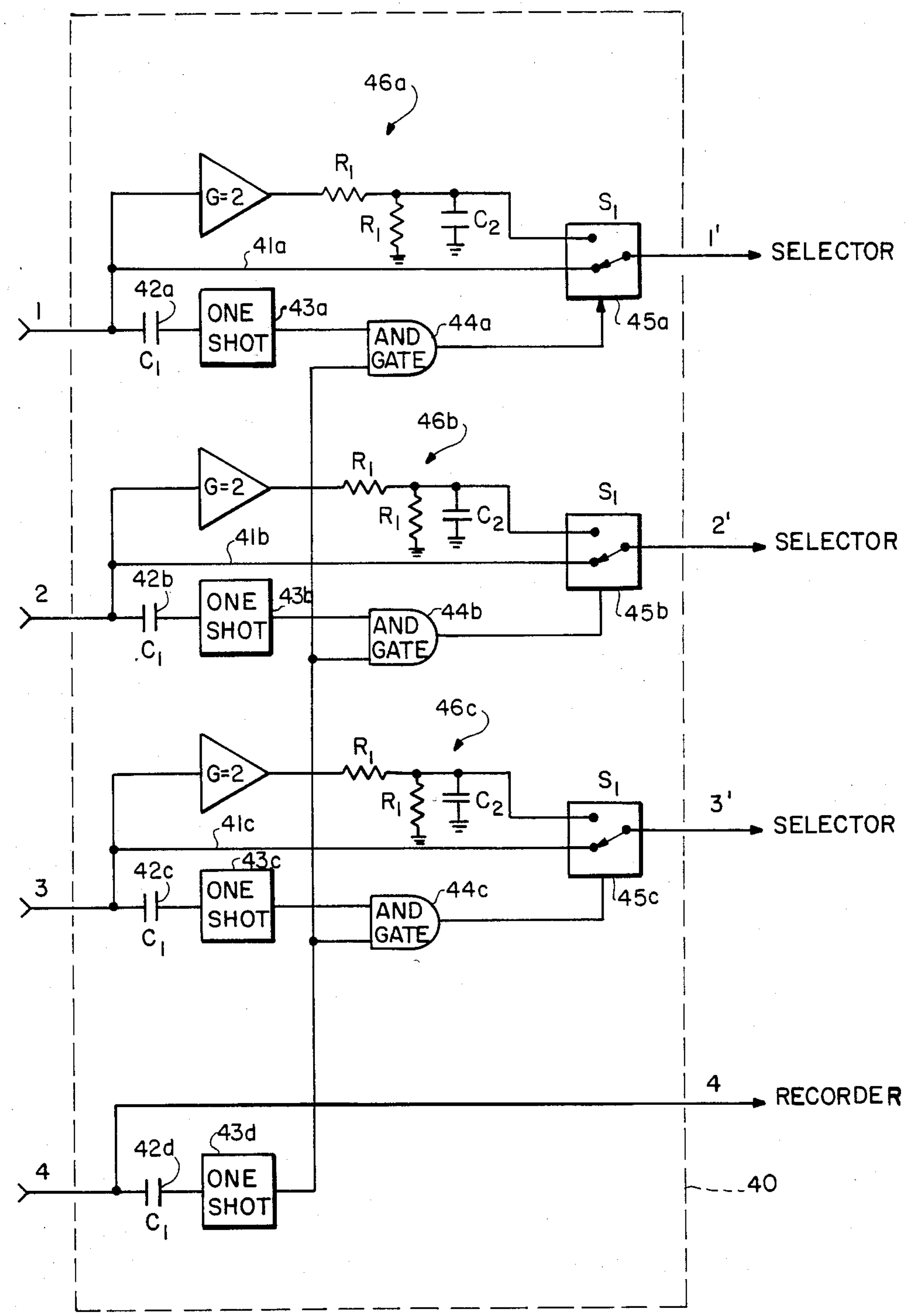
FIG. 2 is a schematical representation of the details of the coincidence determination circuit of FIG. 1.

Since the load of the sensors and the dummy load 26 are substantially identical as are the preamplifiers and line drivers and the total length of the common cable, extraneous pickup generated by undesirable electromagnetic, mechanical or thermal disturbances will be picked up by both the sensor channels and the blind channel. These are the information and interference signals that reach coincidence determination unit 40. Referring to FIG. 2 the 3-sensor data channels 1, 2 and 3 pass their total information content to a data link leads 41*a*, 41*b* or 41*c*. Any signal input appearing on the blind channel passes to recorder 50 by its data link lead 41*d*.

The total signal outputs for the sensor data channels and the blind sensor channel also are coupled through a coupling capacitor 42*a*, 42*b*, 42*c* or 42*d* to an interconnected one-shot multivibrator 43*a*, 43*b*, 43*c* or 43*d*. The coupling capacitors provide an a.c. coupling for the signals and have a magnitude such that a rapidly changing signal on the input side is necessary to exceed the threshold of the interconnected one-shot multivibrator. The one-shot multivibrator selected for this application can be one of a wide variety of devices routinely put together once the operational parameters are known. In this case a type 74121 could be chosen to function suitably for this intended purpose.

An AND gate 44*a*, 44*b* or 44*c* is operatively associated with each of the sensor data channels in the coincidence determination unit and produces an output pulse when coincident signals from either one of the one-shot multivibrators 43*a*, 43*b* or 43*c* occurs with an output pulse from the one-shot multivibrator 43*d*. Typically, the AND gates could be type 7408's. The output pulse from the AND gates is coupled to a solid state switch 45*a*, 45*b* or 45*c*, for example, type 1H5050's from Intersil, and actuates the switch to disconnect the data link 41*a,* 41*b* or 41*c* and connect a d.c. voltage generator circuit 46*a, b* or *c* to switch circuit 49.

The d.c. voltage generators include operational amplifiers having a gain factor of 2 that amplifies the signal and the d.c. bias voltage associated with each of the data channels as well as the blind channel. A voltage divider circuit of equal value resistors $R_1$ divides the amplified potential and stores the d.c. value of the bias potential on capacitor $C_2$. This voltage appearing on capacitor $C_2$ is a level equivalent to the average value of the signal and bias for a temporal period $\Delta T$ relatable to the $R_1C_2$ time constant in the d.c. voltage generator circuit.

Figure 3:
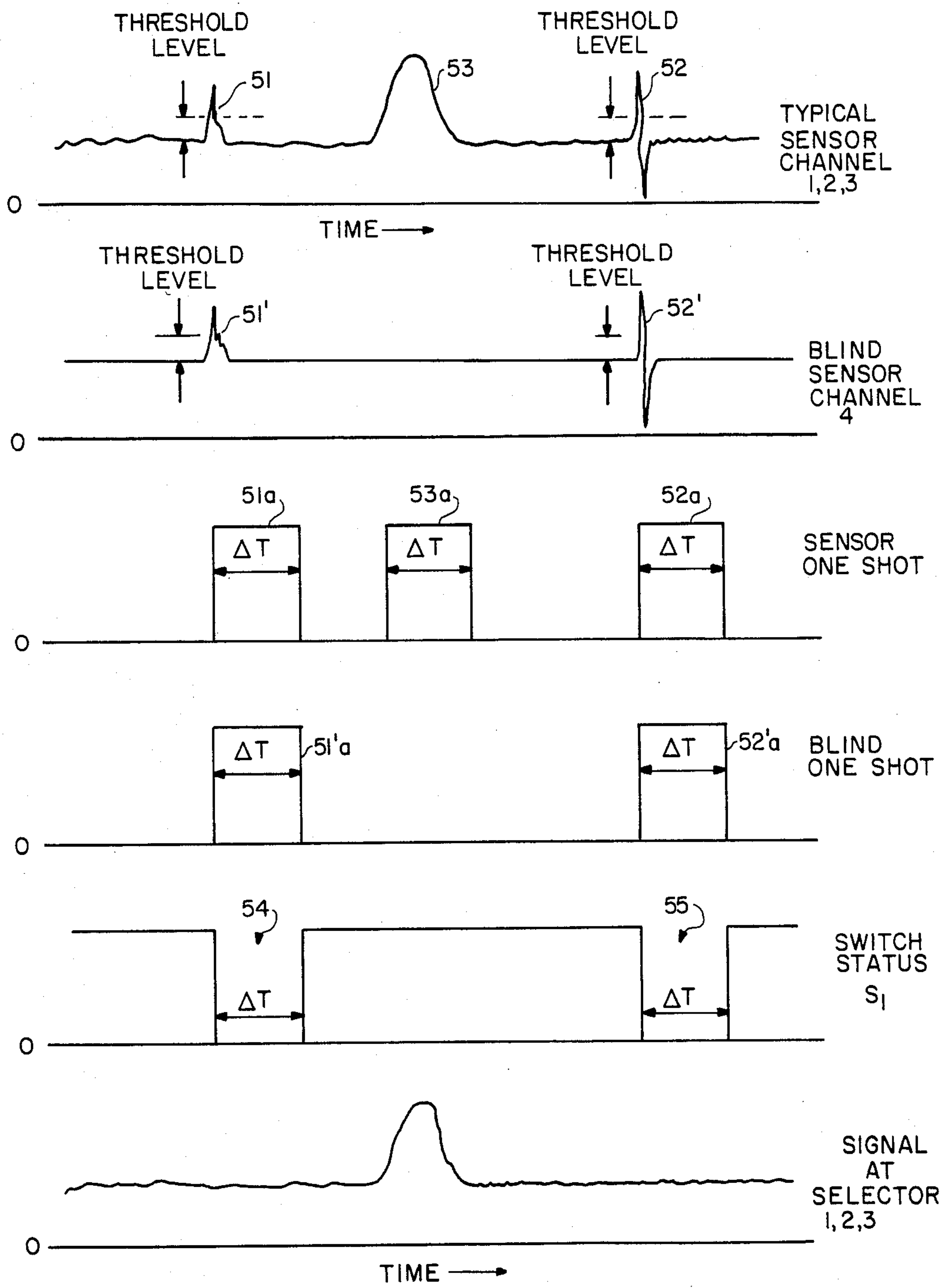
FIG. 3 is a waveform diagram with respect to time of the spurious signals, information signals and consequent switching sequences within the coincidence determination unit that eliminates the spurious signals.

Operation of the coincidence determination unit to eliminate spurious signals at outputs 1', 2' and 3' can be better understood by noting FIG. 3. The top representation shows a typical sensor channel 1, 2 or 3 having spurious signals 51 occur before and 52 occur after sensor information pulse 53. The same spurious signals designated as 51' and 52' appear on blind channel 4. Since there is no information sensed in the blind channel the information signal 53 does not appear in the blind sensor channel.

The composite signals including the two spurious signals along with the information signal are fed to one of the sensor channels in the coincidence determation unit and the spurious signals alone come into the coincidence determination unit on blind channel 4. the rise times of the spurious signals 51, 51' and 52, 52' are sufficient to be a.c. coupled through the capacitors 42*a* and 42*d* to the one-shot multivibrators 43*a* and 43*d.* The threshold levels of the one-shots are exceeded so that a sensor channel pulse 51*a* is generated by sensor channel one-shot and a blind channel pulse 51'*a* is generated by the blind channel one-shot at for the duration of the pulses as preset in the one-shots. The coincidences between the two pulses 51*a* and 51'*a* at AND gate 44*a* actuate switch 45*a* to disconnect data link 41*a* and couple d.c. voltage generator 46*a* to the output of the coincidence determination unit at 1'. The switch status at SI due to the interruption of the switch 45*a* appears during the interval $\Delta T$ as 54. Since the d.c. potential from d.c. voltage generator 46*a* is coupled through switch 45*a* the overall effect will be to pass a smooth, unaffected waveform to selector switch 49 during the first $\Delta T$ interval, note the bottom waveform in FIG. 3.

When information pulse 53 comes into the coincidence determination unit one-shot multivibrator 43*a* is again actuated to produce a data channel pulse 53*a;* however, no coincidence signal is received through the blind channel and consequently no blanking pulse is generated by one-shot multivibrator 43*d.* As a result AND gate 44*a* is not actuated and the state of the data link 41*a* is uninterrupted so that the information pulse is free to travel through. The next spurious signal 52 also is received in the blind channel, as well as a data channel and causes the coincident generation of the data channel pulse 52*a* and the blind channel pulse 52'*a.* Circuit actuation is sufficiently as disclosed above to blank the spurious signal during a blanking period 55 in a manner as outlined above.

Obviously many modifications and variations of the present invention are possible in the light of the above teachings. It is therefore to be understood that within the scope of the appended claims the invention may be practiced otherwise than as specifically described.

What is claimed is:

1. An apparatus for rejecting spurious signals for incoming data at a recorder comprising:

means located at a remote transmitter having a data producing sensor for defining at least one sensor data channel;

means located at the remote transmitter for creating a blind data channel;

means coupled to the sensor data channel defining means and the blind data channel creating means for transmitting any signals thereon to the recorder;

means connected to the transmitting means for providing a data link for the sensor data channel to the recorder;

first means coupled to the signal transmitting means at the recorder for generating a sensor channel pulse whenever a signal on the sensor data channel exceeds a predetermined threshold;

second means coupled to the signal transmitting means at the recorder for generating a blind channel pulse whenever a pickup signal on the blind channel exceeds a predetermined threshold;

means coupled to the sensor channel pulse generating means and the blind channel generating means for initiating the interruption of the data link providing means for the duration of a concident receipt of a blind channel pulse and a sensor channel pulse;

means for providing a potential source; and means coupled to the interruption initiating means for connecting the potential source means to the recorder throughout said duration of said coincident receipt, the connecting means coupling the data link providing means to the recorder when said coincident receipt stops.

2. An apparatus according to claim 1 further including:

first means for coupling the transmitting means to the sensor channel pulse generating means; and second means for coupling the transmitting means to the blind channel pulse generating means, the first and second coupling means beng responsive to increasing signals at a predetermined rate to permit generation of the sensor channel pulse and the blind channel pulse, respectively.

3. An apparatus according to claim 2 in which the sensor channel pulse generating means and the blind channel pulse generating means are one-shot multivibrators responsive to preset thresholds of signals appearing on the sensor and blind channels to produce the sensor channel pulses and the blind channel pulses, respectively.

4. An apparatus according to claim 3 in which the interruption initiating means is an AND gate having two inputs and one output, one input coupled to the one-shot multivibrator of the sensor channel and the other input connected to the one-shot multivibrator of the blind channel.

5. An apparatus according to claim 4 in which the connecting means is a solid state switch being operatively coupled to the output of the AND gate.

6. An apparatus according to claim 5 in which the data link providing means is a lead connected between the transmitting means and the AND gate and the potential source means is a d.c. source for providing a signal devoid of spurious signals during said duration of said coincident receipt of a blind channel pulse and a sensor channel pulse.

7. An apparatus according to claim 6 in which an amplifier and filtered voltage divider derive the d.c. source from a bias potential in the sensor channel.

8. An apparatus according to claim 7 further including:

means for optionally selecting output signals from the data link means and the blind data channel creating means and the sensor data channel defining means and the blind data channel creating means.

9. An apparatus according to claim 8 further including:

a plurality of sensor channel pulse generating means each associated with a separate sensor data channel of a plurality of sensor data channels;

a plurality of data link providing means, each associated with a separate sensor data channel of a plurality of sensor data channels;

a plurality of interruption initiating means each associated with a separate sensor data channel of a plurality of sensor data channels and each coupled to a separate sensor channel pulse generating means and the only blind channel pulse generating means;

a plurality of potential source providing means each associated with a separate sensor data channel of a plurality of sensor data channels; and plurality of potential source connecting means each associated with a separate sensor data channel of a plurality of sensor data channels to connect a separate potential source providing means to the recorder throughout the duration of coincident receipt of a sensor data channel pulse from the associated sensor data channel pulse generating means and a blind channel pulse from the only blind channel pulse generating means, each connecting means coupling the associated data link providing means to the recorder when coincident receipt stops.

10. An apparatus according to claim 1 further including:

a plurality of sensor channel pulse generating means each associated with a separate sensor data channel of a plurality of sensor data channels;

a plurality of data link providing means, each associated with a separate sensor data channel of a plurality of sensor data channels;

a plurality of interruption initiating means each associated with a separate sensor data channel of a plurality of sensor data channels and each coupled to a separate sensor channel pulse generating means and the only blind channel pulse generating means;

a plurality of potential source providing means each associated with a separate sensor data channel of a plurality of sensor data channels; and a plurality of potential source connecting means each associated with a separate sensor data channel of a plurality of sensor data channels to connect a separate potential source providing means to the recorder throughout the duration of coincident receipt of a sensor channel pulse from the associated sensor data channel pulse generating means and a blind channel pulse from the only blind channel pulse generating means, each connecting means coupling the associated data link providing means to the recorder when coincident receipt stops.

11. An apparatus according to claim 10 further including;

means for optionally selecting output signals from the data link means and the blind channel creating means and the sensor data channel defining means and the blind data channel creating means.

12. A method of improving the validity of data by rejecting spurious signals from a recorder comprising:

providing at least one sensor data channel receiving data from a data source to the recorder;

providing a blind data channel adjacent and from the data source to the recorder;

providing a data link to the recorder for the sensor data channel;

generating a sensor channel pulse whenever a signal on the sensor data channel exceeds a predetermined threshold;

generating a blind data channel use whenever a signal on the blind channel exceeds a predetermined threshold;

initiating an interruption of the data link for the duration of a coincident receipt of the sensor channel pulse and the blind channel pulse;

providing a potential source for the sensor data channel; and connecting the potential source to the recorder throughout the duration of the coincident receipt; and disconnecting the potential source from the recorder and reconnecting the data link to the recorder when the coincident receipt stops.

13. A method according to claim 12 further including:

coupling the sensor data channel and the blind data channel to assure the generating of the sensor data channel pulse and the blind channel pulse whenever the rise time of a spurious signal exceeds a predetermined rate.

14. A method according to claim 13 further including:

providing a plurality of data links to the recorder each associated with a separate sensor data channel;

generating sensor data pulses on a plurality of separate sensor data channels;

initiating the interruption of the plurality of data links whenever the associated separate data channel has a sensor data pulse generated thereon and the blind channel has a blind channel pulse generated thereon, such generation being the coincident generation;

coupling a potential source to the recorder throughout the coincident generation; and disconnecting the potential source and reconnecting the data links upon the association of the coincident generation.

* * * * *